(12) United States Patent
Sahara et al.

(10) Patent No.: US 6,275,385 B1
(45) Date of Patent: Aug. 14, 2001

(54) ELECTRONIC CONTROL DEVICE AND JIG DEVICE THEREFOR HAVING CASING INCLINATION COMPENSATING PART

(75) Inventors: Fujio Sahara, Kosai; Toshio Fujimura; Manabu Shigemura, both of Okazaki, all of (JP)

(73) Assignee: Denso Corporation (JP)

( * ) Notice: Subject to any disclaimer, the term of this patent is extended or adjusted under 35 U.S.C. 154(b) by 0 days.

(21) Appl. No.: 09/419,898

(22) Filed: Oct. 18, 1999

(30) Foreign Application Priority Data

Dec. 18, 1998 (JP) .................................................. 10-361328

(51) Int. Cl.⁷ ...................................................... A05K 5/00
(52) U.S. Cl. .......................... 361/752; 361/753; 361/737; 361/683; 439/297; 439/298
(58) Field of Search ..................................... 361/727–730, 361/683–688; 439/297–298

(56) References Cited

U.S. PATENT DOCUMENTS 5,882,220 * 5/1999 Horii et al. ........................... 439/207
6,023,411 * 2/2000 Howell et al. ........................ 361/686
6,065,679 * 5/2000 Levie et al. ...................... 235/462.47
6,101,087 * 8/2000 Sutton et al. ........................ 361/686
6,115,247 * 9/2000 Helot ................................... 361/686
6,220,883 * 4/2001 Helot et al. .......................... 439/341

OTHER PUBLICATIONS

U.S. application Ser. No. 09/346,687 of Matsui et al, filed Jul. 2, 1999.

\* cited by examiner

*Primary Examiner*—Jeffrey Gaffin
*Assistant Examiner*—Tuan Dinh
(74) *Attorney, Agent, or Firm*—Nixon & Vanderhye PC

(57) ABSTRACT

Ribs are unitarily formed on an outer wall surface of a casing to compensate for an inclination of an inner wall surface corresponding to a draw angle provided for molding the inner wall surface. The direction of pins of a casing connector which connects an electronic control circuit of a printed circuit board accommodated within the casing to external wiring coincides with the direction of insertion of a checker connector. Alternatively, a protrusion or recess may be formed on a jig device on which the casing is placed for connection to an operation checking apparatus.

12 Claims, 5 Drawing Sheets

ELECTRONIC CONTROL DEVICE AND JIG DEVICE THEREFOR HAVING CASING INCLINATION COMPENSATING PART

CROSS REFERENCE TO RELATED APPLICATION

The present application relates to and incorporates herein by reference Japanese Patent Application No. 10-361328 filed on Dec. 18, 1998.

BACKGROUND OF THE INVENTION

1. Field of the Invention

The present invention relates to an electronic control device accommodating within a casing a printed circuit board mounted with a plurality of electronic parts, and to a jig device therefor. More particularly, the present invention relates to an electronic control device and a jig device 200 therefor which is useful for fixing a casing in a circuit operation checking process and the like.

2. Related Art

In an electronic control device, an enclosure type casing is used to accommodate therein a printed circuit board mounted with a plurality of electronic parts and to hold fixedly a casing connector near its opening. A checker connector of a checking apparatus is inserted from the opening of the casing into the casing connector to electrically connect an electronic control circuit on the printed circuit board to the checking apparatus, so that the operation of the electronic control circuit may be checked by the checking apparatus.

Specifically, as shown in FIG. 8, a casing 11 is generally shaped by molding and solidifying a molten metal in molding dies so that the casing 11 has an enclosure structure determined by the shape of the molding dies (not shown) and has a sufficient depth. Each of inner wall surfaces 11b of the casing 11 facing each other is shaped to have an inclination of a draw angle θ, so that the casing 11 and the inner die may be separated from each other, for instance, the inner die is drawn from the casing 11, after the molding process. When the casing 11 is 10 shaped by way of aluminum alloy die casting, for instance, it is required to maintain wall thickness of the casing 11 for minimizing voids and the like arising from molten metal flow in the casting process or for reducing weight. For this reason, each of outer wall surfaces 11c of the casing 11 is shaped to have the same draw angle θ.

As shown in FIG. 9, an electronic circuit 15 including electronic parts 17a and 17b mounted on a printed circuit board 16 is accommodated within the casing 11. The electronic control circuit 15 is connected to a casing connector 19 mounted on the printed circuit board 16 and positioned near an opening 11a of the casing 11, so that the electronic circuit 15 accommodated within the casing 11 is checked in the following process by a checking apparatus 100 by the use of a jig device 200 which fixedly holds the casing 11 thereon.

The outer wall surface 11c of the casing 11 is first placed on a horizontal reference plane of the jig device 200 in such a manner that its opening 11a is directed to open in a lateral or horizontal direction. Under this condition, pins of the casing connector 19 of the printed circuit board 16 are directed upward and angularly deviates from the reference plane of the jig device 200 by the draw angle θ of the inner wall surface 11b of the casing 11 (FIG. 8). It is preferred that a checker connector 120 which mates with the casing connector 19 of the printed circuit board 16 at the side of the opening 11a is moved in parallel with the reference plane of the jig device 200. Thus, the directions of mating between the casing connector 19 within the casing 11 and the checker connector 120 of the checking apparatus differ by the draw angle θ of inclination of the inner wall surface 11b. As a result, the connectors 19 and 120 are disabled to be inserted each other smoothly. Even if those are forced to be inserted, unnecessary stress exerts on the connectors 19 and 120 or on the printed circuit board 16. Thus, it is likely to result in that the connectors 19 and 120 or the printed circuit board 16 will be damaged.

SUMMARY OF THE INVENTION

The present invention has been made to overcome the above drawbacks, and has an object to provide an electronic control device and a jig device therefor which are capable of mating a casing connector and a checker connector in the same direction.

According to the present invention, a casing inclination part is provided on either a casing or a jig device of a checking apparatus. The casing inclination part is for compensating an inclination of the casing wall. The casing inclination part maybe a protrusion formed on an outer wall surface of the casing. Alternatively, it may be a protrusion or recess formed on the jig device. The protrusion or the recess has a thickness or depth which corresponds to the inclination of the casing wall. Thus, a casing connector of an electronic control circuit accommodated within the casing is mated with a checker connector in the same direction.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described hereinunder with reference to embodiments and modifications in which the same or similar constructions are designated by the same numerals.

(First Embodiment)

Figure 1:
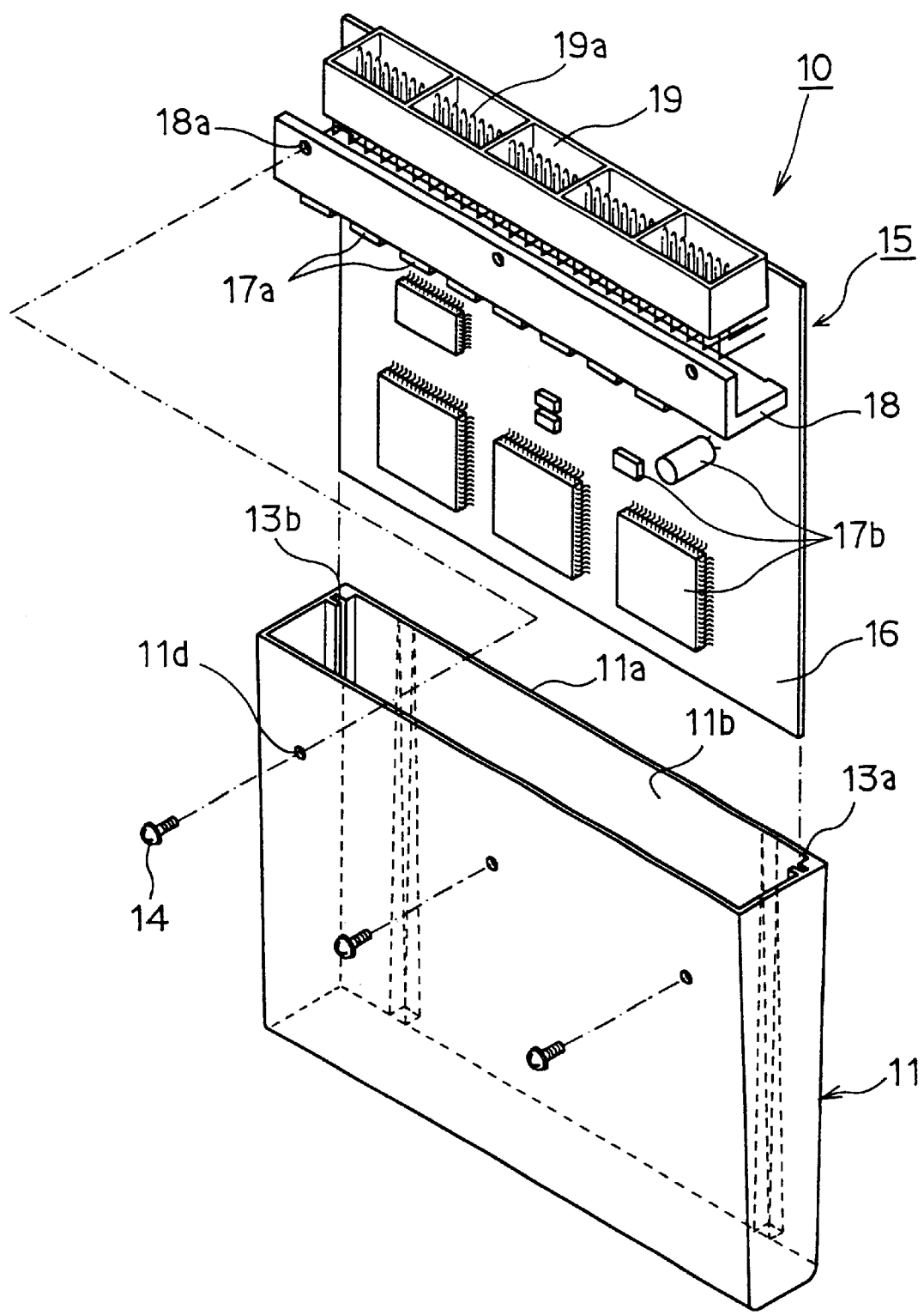
FIG. 1 is an exploded perspective view showing an entire construction of an electronic control device according to a first embodiment of the present invention.
Figure 2:
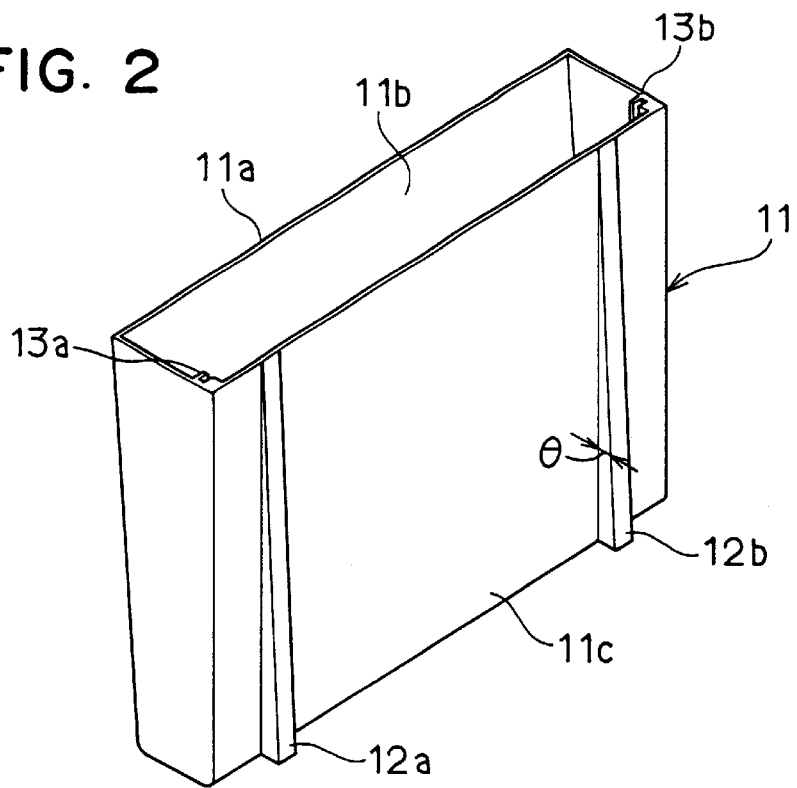
FIG. 2 is a perspective view showing a construction of an outer wall surface of a casing in the electronic control device shown in FIG. 1.
Figure 8:
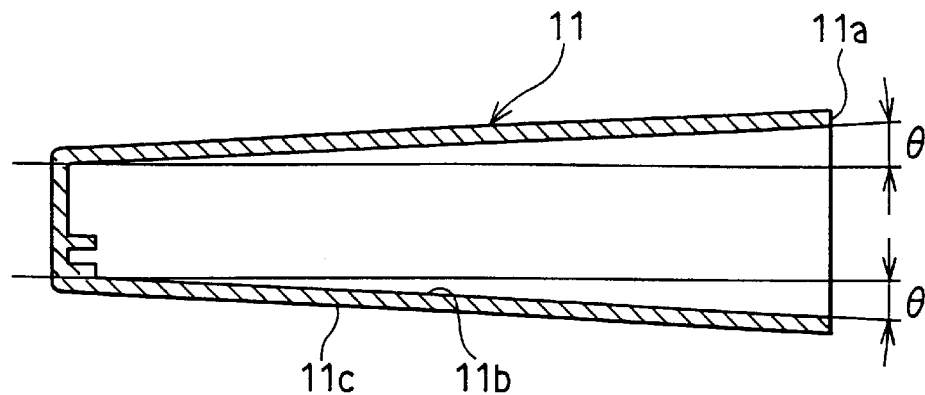
FIG. 8 is a sectional view showing a construction of a casing of an electronic control device according to a related art.
Figure 9:
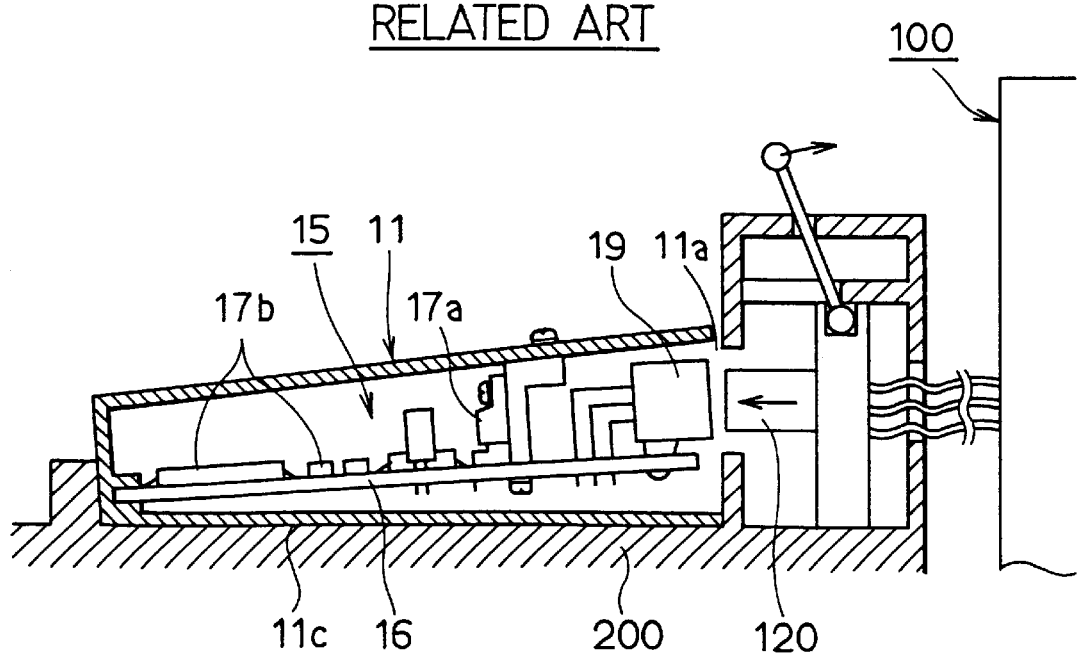
FIG. 9 is a schematic sectional view showing a jig device holding the electronic control device in a checking process according to a related art.

Referring to FIGS. 1 and 2, an electronic control unit (ECU) 10 as an electronic control device is shaped generally into a rectangular parallelepiped body. An electronic control circuit 15 of the ECU 10 comprises various electronic parts 17a, 17b and the like, and is mounted on a printed circuit board 16. The electronic control circuit 16 is accommodated within an enclosure-type casing 11 made of aluminum alloy die cast. The casing 11 is the same type as that shown in FIG. 8 and the side wall defined by an inner wall surface 11b and an outer wall surface 11c has an inclination corresponding to a draw angle θ. Thus, the casing 11 has non-parallel side walls. The casing 11 of the ECU 10 has an opening 11a at its top end surface and ribs (protrusion) 12a and 12b on the right and left parts of its one side outer wall surface 11c. Each of the ribs 12a and 12b has a thickness, which corresponds to the inclination of the side wall. That is, each of the ribs 12a and 12b has an angle θ in opposition to the inclination of the side walls of the casing 11.

Figure 3:
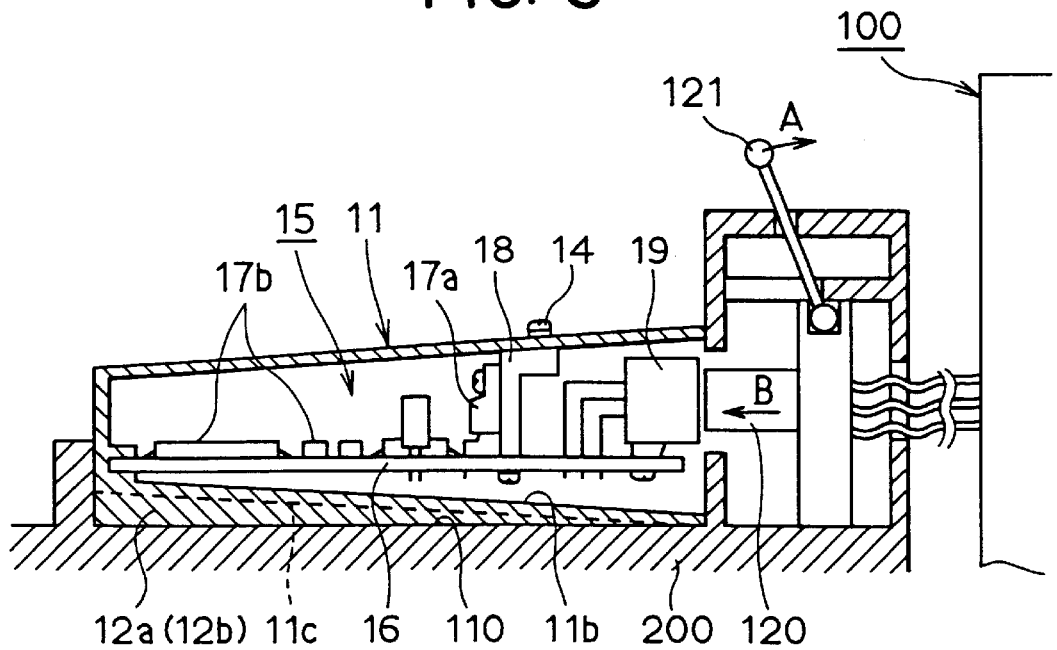
FIG. 3 is a schematic sectional view showing a jig device holding the electronic control device in a checking process according to the first embodiment of the present invention.

The electronic parts 17a are heat-generating type and mounted on the printed circuit board 16 in contact with a heat radiating type heat sink 18 made of an aluminum plate material and the like by screws or adhesives. The heat sink 18 is fixed to the printed circuit board 16 by screws. A casing connector 19 having pins 19a is fixedly provided on the printed circuit board 16 by soldering. As illustrated in FIG. 3, in this embodiment casing connector 19 is held in non-parallel relation with the side walls.

The printed circuit board 16 is inserted into slit grooves 13a and 13b formed to face each other on the inner wall surface of the casing 11. The slit grooves 13a and 13b are provided to hold the printed circuit board 16 in the same angle θ relative to the side wall. The heat sink 18 is fixed by screws 14 which pass through screw holes 18a and through holes lid provided in the casing 11. Thus, when the printed circuit board 16 is inserted and assembled to the casing 11 of the ECU 10, the casing connector 19 is placed in position at the opening 11a of the casing 11. A casing cover and the like which cover the periphery of the casing connector 19 is not shown in the figures.

The checking process of checking the electronic control circuit 15 within the ECU 10 is described next with reference to FIG. 3. In the checking process, the ECU 10 is placed on a reference or horizontal plane (jig surface) 110 of a jig device 200 of a checking apparatus 100. The jig device 200 has a checker connector 120 which mates with the casing connector 19 at the side of the opening 11a.

As shown in FIG. 3, the casing 11 is held fixedly on the jig device 200 in such a manner that the ribs 12a and 12b of the outer wall surface 11c are in abutment with the jig surface 110. The printed circuit board 16 is thus held in parallel with the jig surface 110, because the ribs 12a and 12b have the varying thickness defined by the angle θ and the printed circuit board 16 also has the same angle θ. Thus, the ribs 12a and 12b compensate for the inclination corresponding to the draw angle provided for molding the inner wall surface 11b.

Figure 4:
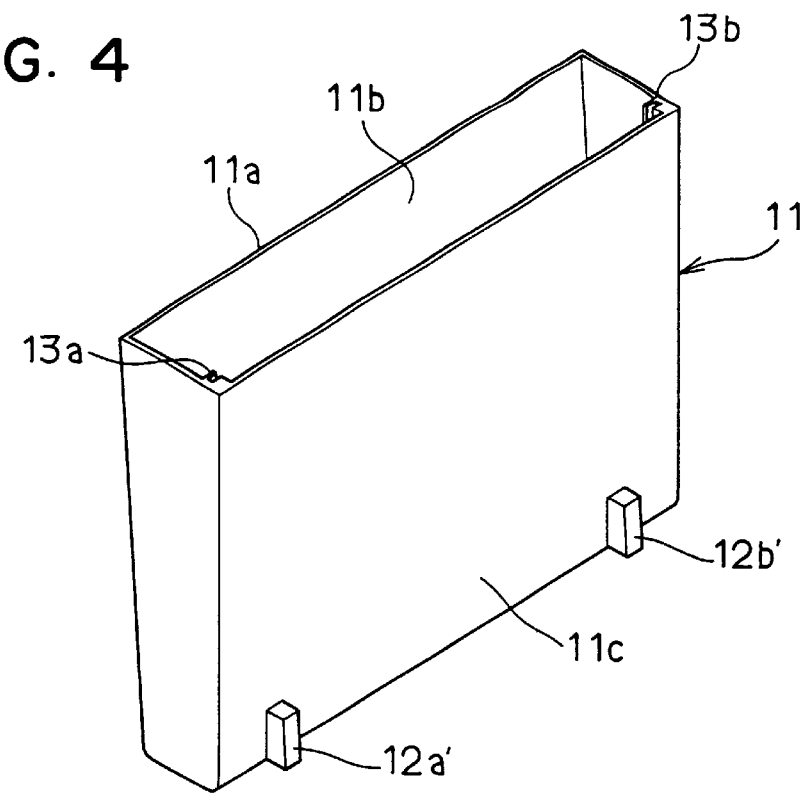
FIG. 4 is a perspective view showing a construction of the outer wall surface of the casing in the electronic control device according to a modification of the first embodiment.
Figure 5:
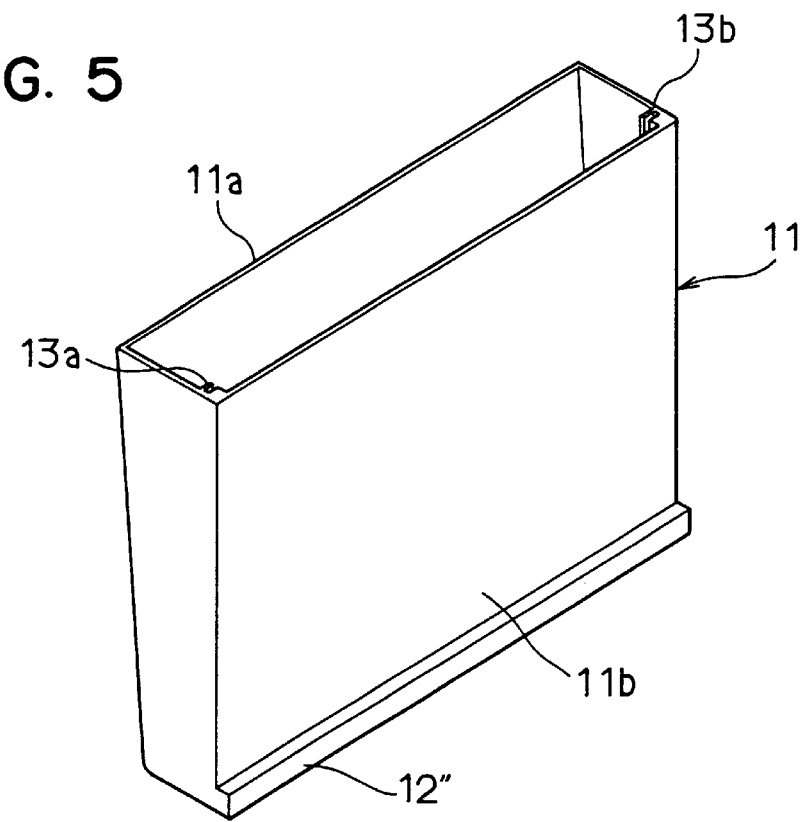
FIG. 5 is a perspective view showing a construction of the outer wall surface of the casing in the electronic control device according to another modification of the first embodiment.

For this reason, the pins 19a of the casing connector 19 fixedly soldered to the printed circuit board 16 are held in parallel with the jig surface 110. That is, the direction of movement of the checker connector 120 at the side of the jig device 200 is made to coincide with the direction of pins 19a of the casing connector 19. As a result, when an operation knob 121 of the jig device 200 is turned in an arrow direction A in FIG. 3, the checker connector 120 is moved in an arrow direction B. Thus, the checker connector 120 is appropriately inserted into the casing connector 19, and the connectors 120 and 19 are electrically connected without fail so that the operation of the electronic control circuit 15 may be checked by the checking apparatus 200. replace the paragraph beginning at page 6, line 12, with the following rewritten paragraph: replace the paragraph beginning at page 8, line 5, with the following rewritten paragraph:

Although the ribs 12a and 12b are formed as the casing inclination compensating parts on the outer wall surface 11c of the casing 11 to extend continuously from the opening 11a to the bottom, ribs 12a' and 12b' may alternatively be formed only near the bottom side opposite the opening 11a as shown in FIG. 4 to compensate for the inclination corresponding to the draw angle required for the casing molding process, so that the same advantage may be provided. Further, as shown in FIG. 5, a rib 12" may be formed adjacent and parallel to the bottom opposite the opening 11a of the casing 11 to compensate for the inclination corresponding to the draw angle required for the casing molding process, so that the same advantage may be provided as well.

(Second Embodiment)

Figure 6:
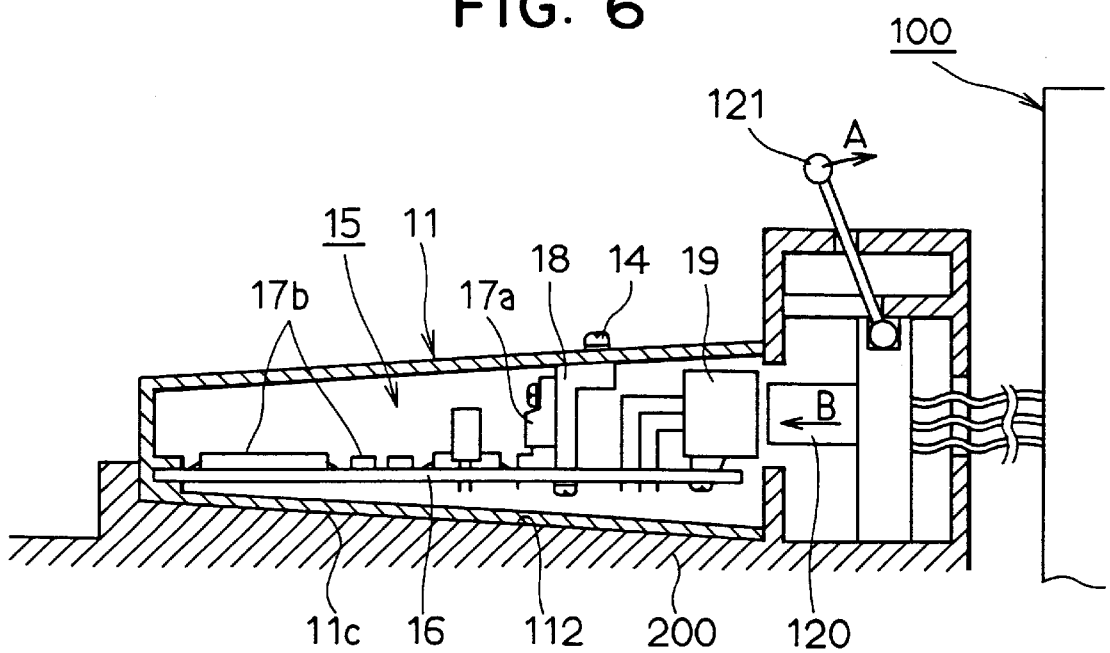
FIG. 6 is a schematic sectional view showing a jig device holding an electronic control device in a checking process according to a second embodiment of the present invention.

In the second embodiment, the casing inclination compensating part is provided on the jig device 200. As shown in FIG. 6, the outer wall surface 11c of the casing 11 has no ribs on the outer wall surface 11c and is placed on a jig surface 112 of the jig device 200. The jig surface 112 is inclined by the same angle as that of the inner wall surface 11b of the casing 11 but in the opposite direction. As a result, the casing 11 is placed in such a manner that its outer wall surface 11c is in direct contact with the jig surface 112 over its entire area.

As a result, the printed circuit board 16 of the electronic control circuit 15 is held in the horizontal direction, that is, in the direction of movement of the checker connector 120. Thus, the direction of movement of the checker connector 120 at the side of the jig device 200 coincides with the direction of pins 19a of the casing connector 19. The checker connector 120 is inserted into the casing connector 19 appropriately thereby to electrically connect the connectors 19 and 120 without causing any damages between the connectors 19 and 120 or in the circuit board 16.

Figure 7:
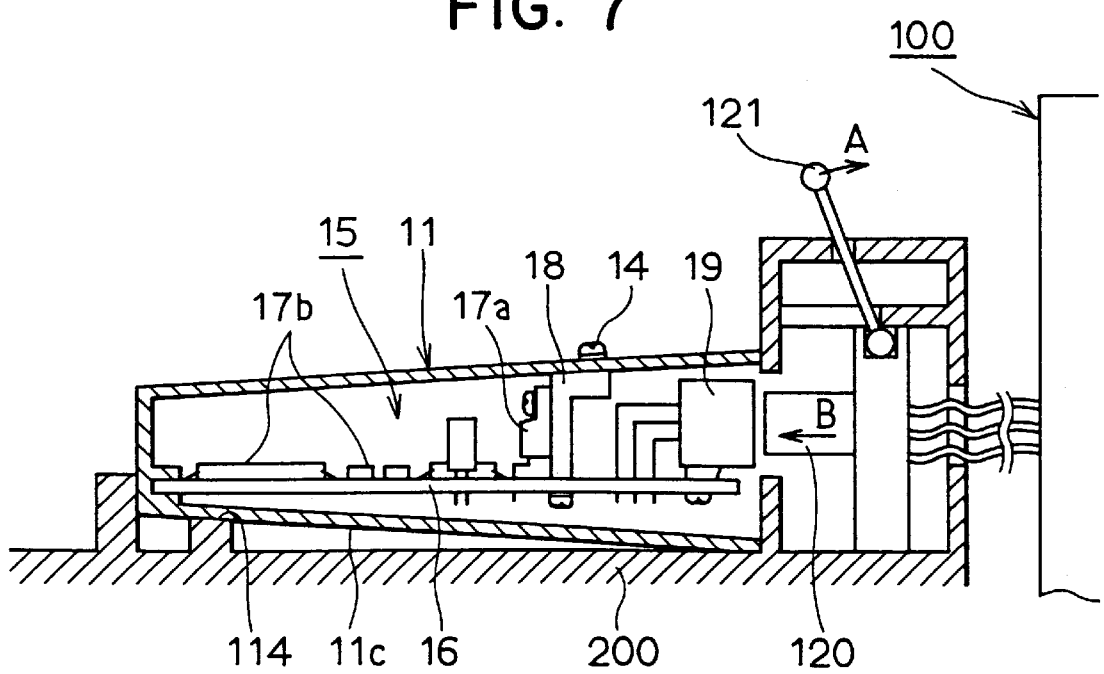
FIG. 7 is a schematic sectional view showing a jig device holding an electronic control device in a checking process according to a modification of the second embodiment.

Although the jig surface 112 is formed as the protrusion relative to the reference plane (horizontal plane) of the jig device 200 in the second embodiment, a jig surface 114 may alternatively be formed as the protrusion relative to the reference plane of the jig device 200 at only one location or at a plurality of locations as shown in FIG. 7 to compensate for the inclination of the side wall of the casing 11. Further, the jig surface may be a recess having an inclined surface which is concave relative to the reference plane of the jig device 200.

It is to be noted that, although the casing 11 of the ECU 10 is made by an aluminum alloy die casting in the above embodiments, the same construction can be employed to provide the same advantage even when it is made of a resin or other materials as long as the printed circuit board 16 is held inclined relative to the outer wall surface of the casing 11.

What is claimed is:

1. A combination comprising:
   an electronic control device having a printed circuit board, a casing having a pair of non-parallel side walls to accommodate the printed circuit board therebetween and an opening at a top end surface of the casing, and a casing connector mounted on the printed circuit board near the opening, the casing connector being held in non-parallel relation with the side walls;
   a jig device having a plane to hold the electronic control device thereon so that the casing connector may be connectable to a checker connector held movably for checking an operation of the electronic control device by a checking apparatus; and an inclination compensating part provided on one of the electronic control device and the jig device to maintain the casing connector and the checker connector in a non-inclined relation therebetween.

2. A combination as set forth in claim 1, wherein the inclination compensating part includes a rib formed unitarily on an outer wall surface of one of the side walls of the casing which is placed on the plane of the jig device.

3. A combination as set forth in claim 2, wherein the rib has a thickness which corresponds to an angle of inclination of the printed circuit board relative to the side walls of the casing.

4. A combination as set forth in claim 3, wherein the thickness of the rib decreases as it extends toward the opening.

5. A combination as set forth in claim 2, wherein the rib extends continuously from the opening to a bottom of the casing.

6. A combination as set forth in claim 2, wherein the rib is formed adjacent and parallel to a bottom of the casing opposite the opening.

7. A combination as set forth in claim 1, wherein the inclination compensating part includes an inclined part provided on the jig device.

8. A combination as set forth in claim 7, wherein the inclined part has a raised part at a position opposite to the checker connector.

9. A combination as set forth in claim 1, wherein the inclination compensating part comprises first and second ribs formed on one side wall of the casing.

10. A combination as set forth in claim 9, wherein the ribs extend continuously from the opening to a bottom of the casing.

11. A combination as set forth in claim 9, wherein the ribs are formed near a bottom side of the casing, opposite the opening.

12. A method for connecting an electronic control device to a jig device, the electronic control device including a printed circuit board, a casing having a pair of non-parallel side walls to accommodate the printed circuit board therebetween and an opening at a top end surface of the casing, and a casing connector mounted on the printed circuit board near the opening, the casing connector being held in non-parallel relation with the side walls, said jig device including a plane to hold the electronic control device thereon so that the casing connector may be connectable to a check connector fixed for checking an operation of the electronic control device by a checking apparatus, said method comprising:

maintaining a non-inclined relation between the casing connector and the checker connector by providing an inclination compensating part on one of the electronic control device and the jig device; and causing a relative movement between the jig device and the electronic control device in a direction in which the casing connector and the checker connector face each other to connect the check connector with the casing connector.

* * * * *